US006699746B2

(12) United States Patent
Chung et al.

(10) Patent No.: US 6,699,746 B2
(45) Date of Patent: Mar. 2, 2004

(54) METHOD FOR MANUFACTURING SEMICONDUCTOR DEVICE

(75) Inventors: Su Ock Chung, Seoul (KR); Sang Don Lee, Kyungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 17 days.

(21) Appl. No.: 10/329,521

(22) Filed: Dec. 27, 2002

(65) Prior Publication Data

US 2003/0124776 A1 Jul. 3, 2003

(30) Foreign Application Priority Data

Dec. 31, 2001 (KR) .......................... 2001-89164

(51) Int. Cl.[7] ................... H01L 21/8242; H01L 21/336
(52) U.S. Cl. .................. 438/239; 438/233; 438/241; 438/253; 438/303; 438/629
(58) Field of Search ............... 438/233, 239, 438/241, 253, 256, 303, 305, 626, 629

(56) References Cited

U.S. PATENT DOCUMENTS

| 5,895,239 | A | * | 4/1999 | Jeng et al. ............... 438/239 |
| 6,344,389 | B1 | * | 2/2002 | Bronner et al. ............ 438/244 |
| 6,372,571 | B2 | * | 4/2002 | Kim .......................... 438/239 |
| 6,544,834 | B1 | * | 4/2003 | Sugawara et al. .......... 438/240 |
| 2002/0081799 | A1 | * | 6/2002 | Kim .......................... 438/233 |

* cited by examiner

*Primary Examiner*—T. N. Quach
(74) *Attorney, Agent, or Firm*—Jacobson Holman PLLC

(57) ABSTRACT

The present invention discloses a method for manufacturing a semiconductor device. In the method for manufacturing the semiconductor device, a contact plug connected to a predetermined region for a bit line contact and a storage electrode contact is formed in a cell region of a semiconductor substrate before a source/drain region is formed in a peripheral circuit region of the semiconductor substrate using an epitaxially grown silicon film in a high temperature process, to obtain a contact plug having a high filling characteristic and a low contact resistance. In addition, additional ion-implantation process of a P type impurity in the subsequent bit line contact formation can be omitted to simplify the fabrication process. The method is suitable for the high speed merged DRAM logic process to achieve the high speed operation of the semiconductor device, and improves a process yield and reliability of the semiconductor device.

8 Claims, 2 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and in particular to an method for manufacturing a semiconductor device which can improve operation characteristics and reliability of the device by forming a contact plug in a cell region before forming a source/drain region in a peripheral circuit region of a semiconductor substrate to allow a high temperature process.

2. Description of the Background Art

In general, a PN junction is formed by ion-implanting an N type impurity or P type impurity into a P type semiconductor substrate or N type semiconductor substrate, and activating the resultant substrate via a thermal process to form a diffusion region.

Therefore, a shallow junction is required to prevent a short channel effect due to lateral diffusion from the diffusion region in a semiconductor device having a reduced channel width.

A conventional method for manufacturing a semiconductor device will now be explained.

An device isolating insulation film defining an active region is formed in a cell region and a peripheral circuit region of a semiconductor substrate.

A stacked structure of a gate insulating film, a conductive layer for gate electrode and a mask insulating film is formed on the entire surface of the resultant structure.

The stacked structure is then etched using a gate electrode mask as an etching mask, thereby forming a stacked structure of a gate insulating film pattern, a gate electrode and a mask insulating film pattern.

Thereafter, a first insulating film is formed on the entire surface of the resultant structure. Here, the first insulating film is composed of a nitride film.

A low concentration impurity is ion-implanted into the entire surface of the resultant structure, thereby forming a lightly doped drain (LDD) region on the semiconductor substrate at both sides of the gate electrode.

A second insulating film is formed on the entire surface of the resultant structure. Here, the second insulating film is composed of a nitride film to form the LDD structure.

An insulating film spacer is formed on the sidewalls of the stacked structure of the gate insulating film pattern, the gate electrode and the mask insulating film pattern by etching the second insulating film and the first insulating film in the peripheral circuit region of the semiconductor substrate.

Then, a source/drain region is formed by ion-implanting a high concentration impurity into the semiconductor substrate at both sides of the insulating film spacer. In the case of a high speed logic process, a silicide film is formed in the source/drain region.

A first interlayer insulating film is then formed on the entire surface of the resultant structure.

Thereafter, a contact hole is formed by etching the first interlayer insulating film, the second insulating film and the first insulating film using a contact mask which expose a predetermined region for bit line contact and storage electrode contact in the cell region of the semiconductor substrate as an etching mask, and an insulating film spacer is formed on the sidewalls of the stacked structure of the gate insulating film pattern, the gate electrode and the mask insulating film pattern. Here, the insulating film spacer is composed of the first insulating film.

A conductive layer composed of a polysilicon layer is formed on the entire surface of the resultant structure.

A contact plug is formed by removing the conductive layer and the first interlayer insulating film via a chemical mechanical polishing (CMP) process.

A second interlayer insulating film is formed on the entire surface of the resultant structure.

Thereafter, the second interlayer insulating film is etched to form a bit line contact hole using a bit line contact mask as an etching mask.

As described above, in the conventional method for manufacturing the semiconductor device the source/drain region in the peripheral circuit region of the semiconductor substrate is formed before the contact plug which connected to the predetermined region for the bit line contact and storage electrode contact in the cell region is formed. However, a subsequent process must be performed below 800° C. to maintain a low contact resistance in the source/drain region. This deteriorates a filling characteristic of the interlayer insulating film and restricts a deposition temperature of the conductive layer for forming the contact plug. In addition, since the entire second insulating film in the cell region must be removed, the first insulating film surrounding the gate electrode is ununiformly damaged. Furthermore, the property of the logic process employing a technique of forming the silicide film after forming the source/drain region is deteriorated due to a thermal process for forming the contact plug, and thus the DRAM technique and the logic high speed process cannot be used together.

SUMMARY OF THE INVENTION

Accordingly, it is an object of the present invention to provide a method for manufacturing a semiconductor device which can prevent characteristics of the device from being deteriorated resulted from a thermal process by forming a contact plug in a predetermined region for a bit line contact and storage electrode contact in a cell region of a semiconductor substrate, and then forming a source/drain region in a peripheral circuit region.

In order to achieve the above-described object of the invention, there is provided a method for manufacturing a semiconductor device including the steps of: forming a first insulating film on a semiconductor substrate having a cell region and a peripheral circuit region, each region having a gate electrode formed thereon; forming an LDD region on the semiconductor substrate at both sides of the gate electrode; forming a first interlayer insulating film on the entire surface of the resultant structure; forming a first insulating film spacer on the sidewalls of the gate electrode in the cell region by etching the first interlayer insulating film land the first insulating film in the cell region using a contact mask exposing a bit line and storage electrode contact region as an etching mask; forming a conductive layer electrically connected to the exposed bit line and storage electrode contact region; removing the first interlayer insulating film in the peripheral circuit region; forming a second insulating film on the entire surface of the resultant structure; forming a second insulating film spacer on the sidewalls of the gate electrode in the peripheral circuit region by etching the second insulating film and the first insulating film; forming a source/drain region by ion-implanting a high concentration impurity into the semiconductor substrate at both sides of the second insulating film spacer; forming a second interlayer insulating film on the entire surface of the resultant structure; and forming a contact plug by planarizing the second interlayer insulating film, the first interlayer insulating film and the conductive layer.

The first insulating film comprises a nitride film having a thickness of 20 to 400 Å.

The first interlayer insulating film is selected from the group consisting of borophospho silicate glass (BPSG) film, tetraethyl ortho silicate (TEOS) film, high density plasma (HDP) oxide film, and combinations thereof.

The conductive layer comprises a polysilicon layer doped with an n type impurity.

The conductive layer is an epitaxially grown silicon film.

The step for forming the source/drain region further includes a step for forming a silicide film on the source/drain region.

The second insulating film comprises a nitride film having a thickness of 20 to 400 Å.

The second interlayer insulating film is selected from the group consisting of high density plasma (HDP) oxide film, tetraethyl ortho silicate (TEOS) film, advanced planarization layer (APL) film, undoped silicate glass (USG) film, and combinations thereof.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing a semiconductor device in accordance with a preferred embodiment of the present invention will now be described in detail with reference to the accompanying drawings.

FIGS. 1 to 4 are cross-sectional diagrams illustrating sequential steps of the method for manufacturing the semiconductor device in accordance with the preferred embodiment of the present invention.

Figure 1:
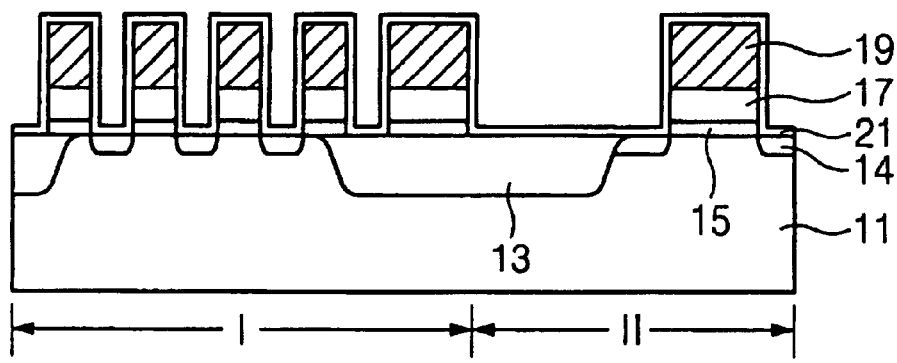
FIGS. 1 to 4 are cross-sectional diagrams illustrating sequential steps of a method for manufacturing a semiconductor device in accordance with a preferred embodiment of the present invention.

Referring to FIG. 1, an device isolating insulation film 13 defining an active region is formed in a cell region I and a peripheral circuit region II of a semiconductor substrate 11.

A stacked structure of a gate insulating film (not shown), a conductive layer for gate electrode (not shown) and a mask insulating film (not shown) is formed on the entire surface of the resultant structure, and then etched using a gate electrode mask as an etching mask to form a stacked structure of a gate insulating film pattern 15, a gate electrode 17 and a mask insulating film pattern 19.

Thereafter, a first insulating film 21 is formed on the entire surface of the resultant structure. Here, the first insulating film 21 is preferably a nitride film having a thickness of 20 to 400 Å.

A low concentration impurity is ion-implanted into the semiconductor substrate at both sides of the gate electrode 17 to form an LDD region 14.

Figure 2:
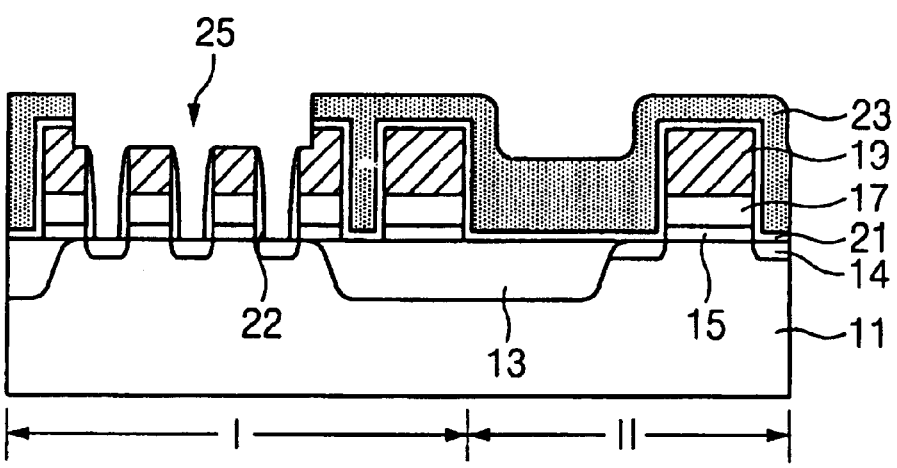

As illustrated in FIG. 2, a first interlayer insulating film 23 is formed on the entire surface of the resultant structure. Here, the first interlayer insulating film 23 is preferably a BPSG film, a TEOS film, a HDP oxide film or combinations thereof.

Thereafter, the first interlayer insulating film 23 and the first insulating film 21 are etched using a contact mask which exposes a predetermined region for a bit line contact and a storage electrode contact in the cell region I as an etching mask to form a contact hole 25, and a first insulating film spacer 22 on the sidewalls of the stacked structure of the gate insulating film pattern 15, the gate electrode 17 and the mask insulating film pattern 19.

Figure 3:
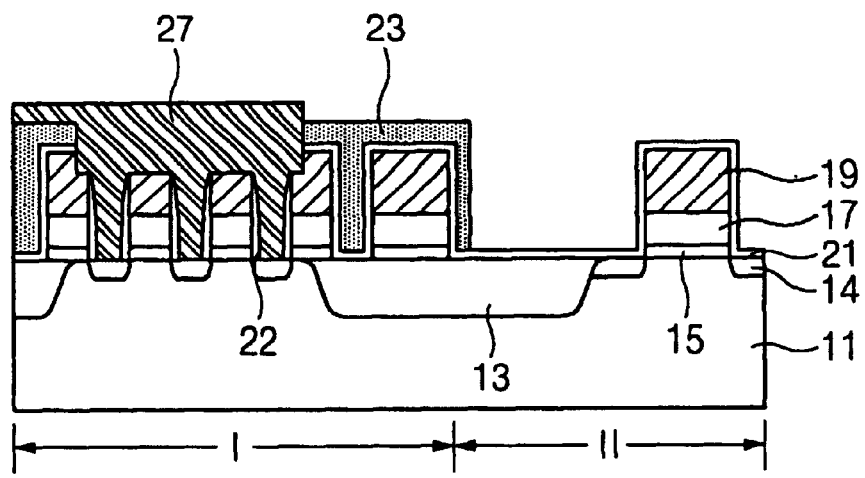

As shown in FIG. 3, a conductive layer 27 filling the contact hole 25 is formed in the cell region I. Preferably, the conductive layer 27 comprises a polysilicon layer doped with an n type impurity.

On the other hand, an epitaxially grown silicon film formed on the semiconductor substrate 11 exposed via the contact hole 25 in the cell region I can be used, instead of the conductive layer 27.

Thereafter, the first interlayer insulating film 23 on the peripheral circuit region II is removed using a cell mask which exposes the peripheral circuit region II as an etching mask. Here, the process for removing the first interlayer insulating film 23 is preferably a dry etching process or wet etching process. The wet etching process is performed by using HF or BOE (buffered oxide etchant) as an etching agent.

A second insulating film (not shown) is formed on the entire surface of the resultant structure. In order to form the LDD structure, the second insulating film is preferably a nitride film.

Figure 4:
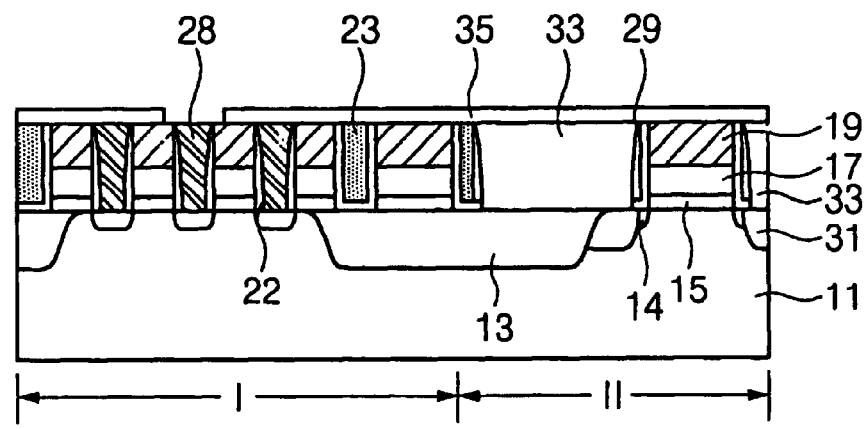

As shown in FIG. 4, a second insulating film spacer 29 is formed on the sidewalls of the stacked structure of the gate insulating film pattern 15, the gate electrode 17 and the mask insulating film pattern 19 in the peripheral circuit region II by etching back the second insulating film and the first insulating film 21.

A source/drain region 31 is formed by ion-implanting a high concentration impurity into the semiconductor substrate 11 at both sides of the second insulating film spacer 29. In the case of a high speed logic process, a silicide film is preferably formed on the source/drain region using Ti or Co film.

A second interlayer insulating film 33 is formed on the entire surface of the resultant structure. Here, the second interlayer insulating film 33 is preferably a HDP oxide film, a TEOS film, an APL film, an USG film or combinations thereof.

A contact plug 28 is formed by removing the second interlayer insulating film 33, the first interlayer insulating film 23 and the conductive layer 27 via a CMP process. Here, the CMP process uses the mask insulating film pattern 19 as an etch barrier.

Thereafter, a third interlayer insulating film 35 is formed on the entire surface of the resultant structure. Preferably, the third interlayer insulating film 35 is a silane film, an USG film, an APL film, a TEOS film or a HDP oxide film. When the third interlayer insulating film 35 is a HDP oxide film, the HDP oxide film is deposited at a thickness of 1000 to 5000 Å and then 200 to 3000 Å of the HDP oxide film is etched back. When the third interlayer insulating film 35 is an APL film or an USG film, the APL film or the USG film is deposited at a thickness of 100 to 2000 Å.

A bit line contact hole is formed via an etching process using a bit line contact mask as an etching mask.

As discussed earlier, in the method for manufacturing the semiconductor device in accordance with the present invention, the contact plug connected to the predetermined region for the bit line contact and storage electrode contact is formed in the cell region of the semiconductor substrate before the source/drain region is formed in the peripheral circuit region of the semiconductor substrate using the epitaxially grown silicon film in the high temperature process, to obtain the contact plug having a high filling charateristics and a low contact resistance. In addition, additional ion-implantation process of a P type impurity in the subsequent bit line contact formation can be omitted to simplify the fabrication process. The method is suitable for the high speed merged DRAM logic process to achieve the high speed operation of the semiconductor device, and improves a process yield and reliability of the semiconductor device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a semiconductor device, comprising the steps of:

forming a first insulating film on a semiconductor substrate having a cell region and a peripheral circuit region, each region having a gate electrode formed thereon;

forming an LDD region on the semiconductor substrate at both sides of the gate electrode;

forming a first interlayer insulating film on the entire surface of the resultant structure;

forming a first insulating film spacer on the sidewalls of the gate electrode in the cell region by etching the first interlayer insulating film and the first insulating film in the cell region using a contact mask exposing a bit line and storage electrode contact region as an etching mask;

forming a conductive layer electrically connected to the exposed bit line and storage electrode contact region;

removing the first interlayer insulating film in the peripheral circuit region;

forming a second insulating film on the entire surface of the resultant structure;

forming a second insulating film spacer on the sidewalls of the gate electrode in the peripheral circuit region by etching the second insulating film and the first insulating film;

forming a source/drain region by ion-implanting a high concentration impurity into the semiconductor substrate at both sides of the second insulating film spacer;

forming a second interlayer insulating film on the entire surface of the resultant structure; and forming a contact plug by planarizing the second interlayer insulating film, the first interlayer insulating film and the conductive layer.

2. The method according to claim 1, wherein the first insulating film comprises a nitride film having a thickness of 20 to 400 Å.

3. The method according to claim 1, wherein the first interlayer insulating film is selected from the group consisting of borophospho silicate glass (BPSG) film, tetraethyl ortho silicate (TEOS) film, high density plasma (HDP) oxide film, and combinations thereof.

4. The method according to claim 1, wherein the conductive layer comprises a polysilicon layer doped with an n type impurity.

5. The method according to claim 1, wherein the conductive layer is an epitaxially grown silicon film.

6. The method according to claim 1, wherein the step for forming the source/drain region further comprises a step for forming a silicide film on the source/drain region.

7. The method according to claim 1, wherein the second insulating film comprises a nitride film having a thickness of 20 to 400 Å.

8. The method according to claim 1, wherein the second interlayer insulating film is selected from the group consisting of high density plasma (HDP) oxide film, tetraethyl ortho silicate (TEOS) film, advanced planarization layer (APL) film, undoped silicate glass (USG) film, and combinations thereof.

* * * * *